United States Patent [19]

Bartlett

[11] 4,063,121
[45] Dec. 13, 1977

[54] INPUT CONVERTER
[75] Inventor: Peter G. Bartlett, Davenport, Iowa
[73] Assignee: Automation Systems Inc., Eldridge, Iowa
[21] Appl. No.: 707,630
[22] Filed: July 22, 1976
[51] Int. Cl.$^2$ .............................................. H03K 3/26
[52] U.S. Cl. .................................. 307/311; 307/229; 250/551
[58] Field of Search .................... 307/311, 211 J, 229; 330/59; 250/552, 551

[56] References Cited
U.S. PATENT DOCUMENTS

| | | | |
|---|---|---|---|
| 3,752,980 | 8/1973 | Dixon et al. | 250/552 |
| 3,795,821 | 3/1974 | Ichiyanagi | 307/311 |
| 3,801,837 | 4/1974 | Pease | 307/311 |
| 3,842,259 | 10/1974 | Bruning | 307/311 |

Primary Examiner—Stanley D. Miller, Jr.
Assistant Examiner—B. P. Davis
Attorney, Agent, or Firm—Woodard, Weikart, Emhardt & Naughton

[57] ABSTRACT

An input converter circuit for producing a logic level indication of the on or off condition of an input. The input may be AC or DC at any reasonable level. A bilateral photocoupler output is applied to an operational amplifier integrator, which establishes the integration time of the signal. The amplifier output is coupled to a Schmitt trigger having threshold levels at about one third and two thirds of the power supply voltage. The output of the Schmitt trigger provides a logic one output if there is an input signal present and a logic zero output otherwise.

12 Claims, 1 Drawing Figure

INPUT CONVERTER

BACKGROUND OF THE INVENTION

1. Field of the Invention:

This invention is in the field of input converters for electrical load circuits.

2. Description of the Prior Art:

In the past, there have been problems with photocouplers when a converter is used for AC inputs, because the photocouplers were unilateral in nature. The converters therefore only sensed current in every other half cycle. Further, in the past, the collector voltage of the phototransistor has been at a supply voltage, such as 12 volts. Therefore, the possibility of leakage, or noise, of the phototransistor was significant.

SUMMARY OF THE INVENTION

Described briefly is an imput signal converter comprising a photodetector which includes two light-emitting diodes in parallel connection of opposite polarity, having an input coupled from an input signal source and having an output, and signal processing means for processing the output of the photodetector to produce a logic level indicative of the presence or absence of an input signal.

It is an object of the present invention to provide an input converter utilizing a bilateral photocoupler which emits light during both the positive and negative half cycles of an AC line signal.

It is a further object of the present invention to provide an input converter having reduced leakage, or noise, through operation of the device in a current mode with a significantly lowered collector voltage on the phototransistor.

Further objects and advantages of the present invention shall be apparent from the following detailed description and accompanying FIGURE.

DESCRIPTION OF THE PREFERRED EMBODIMENT

Figure 1:
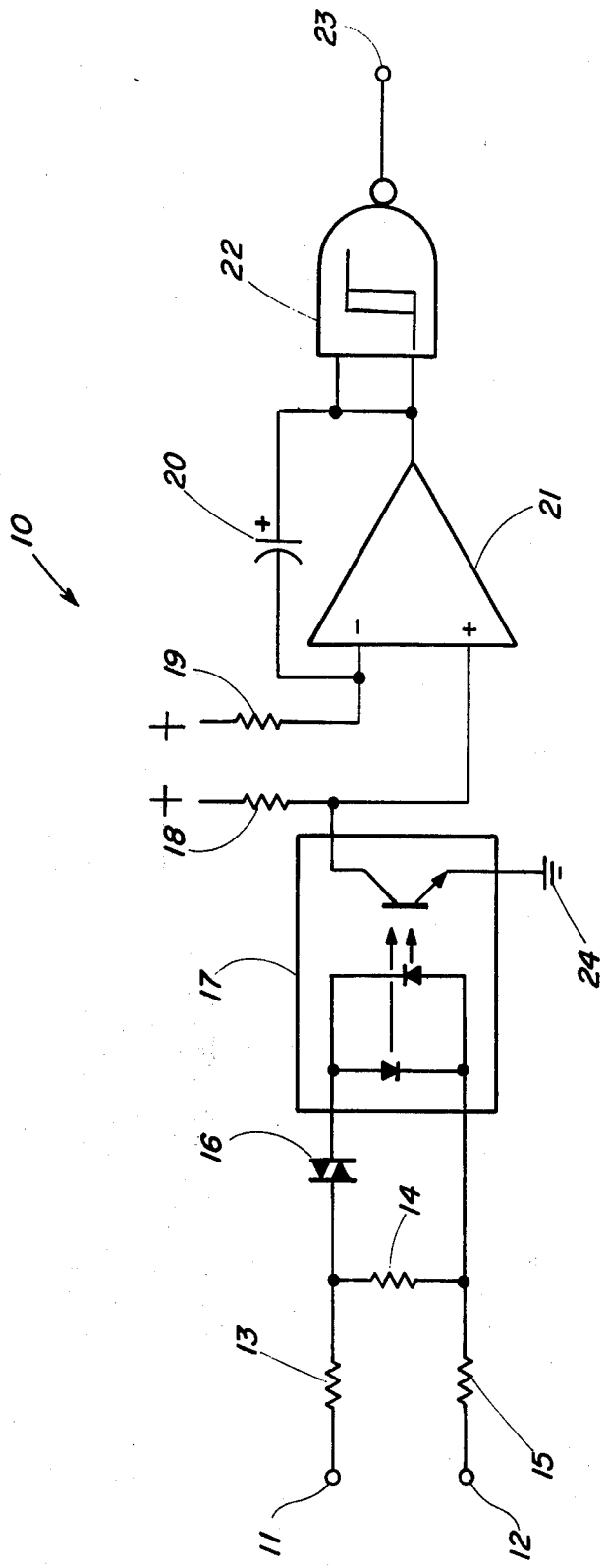
FIG. 1 is a schematic diagram of an input converter according to the present invention.

For the purpose of promoting an understanding of the principles of the invention, reference will now be made to the embodiment illustrated in the drawing and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring in particular to the FIGURE, an input converter circuit 10 is shown. An input signal to be recognized is placed across terminals 11 and 12, such as a 110 volt AC 60 cycle line voltage. In this case resistors 13, 14 and 15 are about 10K ohms. These resistors provide loading for the line and may be varied as a sensitivity adjustment depending upon the voltage utilized. Diac 16 provides a bilateral threshold of, for example, 32 volts to fire, then dropping to approximately 20 to 25 volts. Diac 16 provides temperature stability.

The output signal from diac 16 is connected to optical coupler 17, which has a parallel photodiode package.

The photo-diodes are connected in opposite polarity as shown and emit light in the infrared region to the base of the phototransistor in the optical coupler 17. Photocoupler 17 is a General Electric type H11AA1 or 2. It can be noted that there are no external connections to the base of the phototransistor in the preferred embodiment.

Operational amplifier 21 is one section of a quad-current opamp such as RCA type CD3401. Resistor 18 is 100K ohms and is coupled on one side to B+ such as 12 volts and on the other side to the collector of the phototransistor and the plus input of operational amplifier 21. The emitter of the phototransistor is grounded as shown at 24. The minus input to operational amplifier 21 is connected to one side of 200K resistor 19, whose other side is connected also to B+. The collector of the phototransistor is maintained at a voltage no more than about the base-to-emitter turn-on voltage of the phototransistor and no less than the collector-to-emitter saturation voltage of the phototransistor. The plus input of amplifier 21 is separated by one device junction drop from ground.

Amplifier 21 functions as a current amplifier rather than a voltage amplifier wherein, in a no input condition, with the phototransistor nonconductive, approximately 100 microamps flows into the plus input of operational amplifier 21 and approximately 50 microamps flows into the minus input. In this condition the output of the operational amplifier is high, on the order of the B+ voltage. Amplifier 21 has a low voltage, current sensitive, low impedance input to which the collector of the phototransistor connects. The operational amplifier output is coupled to Schmitt trigger 22 which has its threshold points at about one third and two thirds of B+, respectively. In this high input condition, the output at 23 of Schmitt trigger 22 is low, indicative of no input signal being applied at terminals 11 and 12. Schmitt trigger 22 is, for example, a type RCA CMOS CD 4093.

If there is an AC line input signal on terminals 11 and 12, the photodiodes emit light, turning on the phototransistor, and part of the current flowing into the plus input of the operational amplifier 21 during the no load condition is shunted through the phototransistor to ground. Due to the gain of amplifier 21, as long as the current into the plus input exceeds the current into the minus input the output voltage will be approximately B+. In the absence of feedback capacitor 20, when the current into the plus input decreases to the point that it is less than the current into the minus input of amplifier 21, the output voltage of the amplifier goes to zero within about a microsecond. When integrating capacitor 20, the time for decreasing from B+ to zero volts with an input current reversal is increased to the order of 10 milliseconds with capacitor 21 about 0.1 microfarads. This is longer than the time for a half cycle of a 60 cycle line signal, thereby smoothing out the input current variations to amplifier 21 resulting from the cycling on and off of the photocoupler 17 in response to the line frequency.

With an AC line input to he opposite polarity photodiodes in photocoupler 17, sufficient current is shunted through the phototransistor at a 120 cycle per second rate to cyclicly reduce the current into the plus input of the amplifier 21 below that of the current into the minus input. This results, with the component values indicated, in an output wave form at the output of the amplifier of a 120 cycle per second pulse train having a peak value on the order of 1 volt and about a 4 millisecond dead time. This 1 volt value is well below the threshold value of the Schmitt trigger 22 and therefore, during an input signal condition, the output of the Schmitt trigger at 23 will be high, or at a logic 1.

A DC input of either polarity may obviously be used to activate photocoupler 17, and amplitude variations of the input voltage may be accommodated by appropriate adjustment of resistors 13, 14 and 15 and diac 16. Operating the phototransistor at a collector voltage on the order of 0.6 of a volt decreases the leakage problems normally associated with phototransistors operating at a collector voltage in the order of 12 volts or other large B+ value. In addition there is a reduced Miller effect from the collector to the base of the phototransistor due to the low input impedance of the current amplifier, since there is less voltage swing and therefore less capacitive coupling from collector to base.

The use of a bilateral photocoupler which emits light both during the positive and negative half cycles of the line in AC operation effectively doubles the signal input power to the optical sensor. Further, the input current has been doubled, thereby reducing statically coupled signals into the input lines by a factor of two or better. These two improvements give a fourfold increase in effective energy sensed by the phototransistor. With the above-mentioned improvement in leakage, or noise, obtained by lowering the phototransistor collector voltage from, for example, 12 volts to 0.6 volts, the circuit is virtually independent of the photocoupler device parameters. The input converter circuit may be utilized in a group of four or multiples of four such as for operation on a four-bit bus.

In the circuit diclosed herein, the essentially constant current source of resistor 18 and the supply voltage produces a voltage at the collector of the phototransistor at a level no more than about the base-to-emitter turn-on voltage of the phototransistor and no less than the collector-to-emitter saturation voltage of the phototransistor.

While there have been described above the principles of this invention in connection with specific apparatus, it is to be clearly understood that this description is made only by way of example and not as a limitation in the scope of the invention.

What is claimed is:

1. An input signal converter comprising:
   1. an input coupled from an input signal source;
   2. light emitting means coupled to said input for producing light in response to input signals;
   3. a light sensitive semiconductor device positioned adjacent said light emitting means;
   4. an amplifier having a low voltage, current sensitive, low impedance input connected in shunt across said light sensitive device; and
   5. a constant current source supplying current to the shunted pair of said light sensitive device and said amplifier input.

2. The input converter of claim 1 in which said light emitting means includes two light emitting diodes in parallel connection of opposite polarity.

3. The input converter of claim 1 which further comprises a Schmitt trigger coupled to the output of said amplifier.

4. The input converter of claim 1 in which the voltage across said shunted pair does not exceed about 0.6 volt.

5. The input converter of claim 1 in which said amplifier is a two-input current operational amplifier having a second input coupled from a second current source and having a capacitor coupled from the output of the amplifier to said second input.

6. The input converter of claim 5 in which the second input of the two input amplifier is its minus input and in which the shunted pair includes the plus input.

7. The input converter of claim 1 in which said light sensitive device is a phototransistor and said constant current source provides current of a value such that the voltage at the collector of said phototransistor is no more than about the base-to-emitter turn-on voltage of said phototransistor and no less than the collector-to-emitter saturation voltage of the phototransistor.

8. The input converter of claim 7 in which there are no external connections to the base of the phototransistor.

9. The input converter of claim 8 in which the voltage across said shunted pair does not exceed about 0.6 volt.

10. The input converter of claim 9 in which said amplifier is a two-input current operational amplifier having a second input coupled from a second current source and having a capacitor coupled from the output of the amplifier to said second input.

11. The input converter of claim 10 which further comprises a Schmitt trigger coupled to the output of said amplifier.

12. The input converter of claim 3 in which said light emitting means includes two light emitting diodes in parallel connection of opposite polarity.

* * * * *